United States Patent
Lee

(10) Patent No.: US 9,047,782 B1
(45) Date of Patent: Jun. 2, 2015

(54) VEHICLE ULTRASONIC PARKING ASSISTANCE APPARATUS INCLUDING CHARGE PUMPING CIRCUIT AND METHOD OF OPERATING THE SAME

(71) Applicant: HYUNDAI MOBIS CO., LTD., Yongin-si (KR)

(72) Inventor: Jae Young Lee, Yongin-si (KR)

(73) Assignee: Hyunudai Mobis Co., Ltd., Yongin-si (KR)

( * ) Notice: Subject to any disclaimer, the term of this patent is extended or adjusted under 35 U.S.C. 154(b) by 74 days.

(21) Appl. No.: 14/087,526

(22) Filed: Nov. 22, 2013

(30) Foreign Application Priority Data

Nov. 12, 2013 (KR) .................. 10-2013-0136909

(51) Int. Cl.
*B60Q 1/48* (2006.01)
*B60W 30/06* (2006.01)
*G08G 1/16* (2006.01)

(52) U.S. Cl.
CPC ...................................... *G08G 1/168* (2013.01)

(58) Field of Classification Search
CPC ........... B60W 30/06; G08B 1/16; B60Q 1/48; G08G 1/14; G01S 15/93; G01S 15/931; G07B 15/02; H02M 3/07

USPC ................ 340/932.2, 933; 701/1, 23, 25, 70; 315/307; 323/234; 363/59, 60

See application file for complete search history.

(56) References Cited

U.S. PATENT DOCUMENTS

| | | | |
|---|---|---|---|
| 8,295,064 B2 * | 10/2012 | Shiwaya | 363/60 |
| 2011/0043140 A1 * | 2/2011 | Shiu | 315/307 |

FOREIGN PATENT DOCUMENTS

| | | |
|---|---|---|
| GB | 2488390 A | 8/2012 |
| JP | 2009-118592 A | 5/2009 |
| KR | 10-2006-0119302 A | 11/2006 |
| KR | 10-2010-0126942 A | 12/2010 |

* cited by examiner

*Primary Examiner* — Hung T Nguyen
(74) *Attorney, Agent, or Firm* — NSIP Law

(57) ABSTRACT

Provided are a vehicle ultrasonic parking assistance apparatus including a charge pumping circuit and a method of operating the same. The vehicle ultrasonic parking assistance apparatus changes a transmission output voltage in a voltage driving scheme without using a transformer. By using the charge pumping circuit instead of the transformer so as to boost a voltage, the manufacturing cost is reduced, and a signal is input to the ultrasonic converter at the same voltage as a voltage of when the transformer is used. Also, the charge pumping circuit is provided at a region in which the variable current source was provided, and thus, the manufacturing cost is not additionally expended. Furthermore, since only a conversion of energy by the ultrasonic converter is considered, designing is simplified.

12 Claims, 7 Drawing Sheets

VEHICLE ULTRASONIC PARKING ASSISTANCE APPARATUS INCLUDING CHARGE PUMPING CIRCUIT AND METHOD OF OPERATING THE SAME

CROSS-REFERENCE TO RELATED APPLICATIONS

This application claims priority under 35 U.S.C. §119 to Korean Patent Application No. 10-2013-0136909, filed on Nov. 12, 2013, the disclosure of which is incorporated herein by reference in its entirety.

TECHNICAL FIELD

The present invention relates to a vehicle ultrasonic parking assistance apparatus including a charge pumping circuit and a method of operating the same, and more particularly, to a parking assistance apparatus based on a voltage driving scheme using a charge pumping circuit and a method of operating the same.

BACKGROUND

A related art vehicle ultrasonic parking assistance apparatus is an apparatus that transmits an ultrasonic wave to an object, and processes a signal reflected from the object to calculate distance information to the object. The related art vehicle ultrasonic parking assistance apparatus amplifies power of the signal reflected from the object to determines noise, and generates a high-voltage signal by using a transformer to transmit a high-power ultrasonic wave.

That is, the related art vehicle ultrasonic parking assistance apparatus transmits/receives a sound wave having a frequency of 20 kHz to 80 kHz by using an ultrasonic converter that converts a voltage into a sound pressure and converts a sound pressure into a voltage.

Generally, as an intensity of a transmission sound wave increases, a level of a signal reflected from an object increases, the related art vehicle ultrasonic parking assistance apparatus inputs an alternating current (AC) voltage of 20 V to 100 V or more to the ultrasonic converter so as to prevent an object from being inaccurately recognized or from not being recognized.

However, since a level of a voltage used in general controllers is limited to a vehicle battery voltage 16V or less, the related art vehicle ultrasonic parking assistance apparatus needs a boosting circuit (a boosting transformer: a transformer that is serially disposed on a line, and increases a voltage) for using the ultrasonic converter.

The related art vehicle ultrasonic parking assistance apparatus, as illustrated in FIG. 1, inputs a high voltage equal to or higher than a vehicle battery voltage to an ultrasonic converter 20 according to a turn ratio by using a transformer 10. In this case, a turn ratio of the transformer 10 and a ratio of an input voltage and an output voltage are as expressed in the following Equation (1):

$$\frac{N_2}{N_1} = \frac{V_2}{V_1} \quad (1)$$

where $N_2$ denotes the number of turns of wire on an output part, $V_2$ denotes an output voltage, $N_1$ denotes the number of turns of wire on an input part, and $V_1$ denotes an input voltage.

Therefore, if a voltage output from a controller 30 is $V_1$, the transformer 10 outputs a voltage $$"\frac{N_2}{N_1} V_1",$$

which passes through a matching circuit 40 and is input to the ultrasonic converter 20.

However, the transformer 10 applied to the related art vehicle ultrasonic parking assistance apparatus is based on an inductor on which a wire is wound, and thus has a limitation in reducing a size.

That is, since the transformer 10 occupies 5% or more of an area of a printed circuit board (PCB) equipped in the related art vehicle ultrasonic parking assistance apparatus, a size of the transformer 10 is relatively greater than that of a surface-mount device (SMD). Also, since the transformer 10 is high in height, the transformer 10 is not suitable for an element of an ultrasonic parking assistance apparatus for small vehicles.

In the transformer 10, when a turn ratio and a ratio of an input voltage and an output voltage are as expressed in the following Equation (2), power passing through the transformer 10 can be greatly lost according to a coupling coefficient K ($0 \leq K \leq 1$) used to determine a mutual inductance value.

$$\frac{V_2}{V_1} = K \frac{N_2}{N_1} \quad (2)$$

In the related art vehicle ultrasonic parking assistance apparatus including the transformer 10, a signal generation method performed by the controller 30 controls a current, and thus, a number of resources are needed for ideally implementing a variable current source 31 in the controller 30.

Moreover, the ultrasonic converter 20 is an element that converts a voltage into a sound pressure, and thus, when ten transmission signals are generated by a current driving scheme, as shown in FIG. 2, an output voltage can be distorted by a dispersion of the transformer 10. Also, a frequency of each of the generated transmission signals is broadly distributed as shown in FIG. 3, an output of a transmission frequency band is more lowered.

Generally, the transformer 10 used in a manufacturing process has ±3% error, and a frequency response of a transmission circuit can be changed by the error.

An application specific integrated circuit (ASIC) uses a digital filter having a high Q value for increasing a signal-to-noise ratio (SNR) of a reception signal. In this case, since the matching circuit 40 does not match a frequency of a transmission/reception signal due to the dispersion of the transformer 10, an end part of a free vibration signal in the ultrasonic converter 20 is greatly changed, and due to this, a defective ultrasonic parking assistance apparatus for vehicles that inaccurately recognizes a near object can be produced.

Moreover, an attenuation characteristic of an ultrasonic wave is differently shown according to an environment such as a temperature of a medium or the like, and unlike medical ultrasonic apparatuses, a use temperature range of a vehicle ultrasonic parking assistance apparatus is a range of −40 to 85 degrees C. Therefore, a level of a transmission voltage or an amplification rate of a reception signal should be changed according to an environment so as to obtain a predetermined level of reception signal regardless of the environment.

However, in the related art vehicle ultrasonic parking assistance apparatus, a level of an actual reflection signal is low, and thus, when greatly changing the amplification rate of the reception signal so as to obtain the predetermined level of reception signal, noise is also amplified. Due to the amplified noise, an occurrence probability of false alarm becomes higher.

To briefly summarize the above-described details, since the related art vehicle ultrasonic parking assistance apparatus uses the current driving scheme, the transformer 10 is needed for inputting a driving voltage to the ultrasonic converter 20. Also, since the transformer 10 has a broader area and a higher height than those of the SMD, the transformer 10 is not suitable as an element used to manufacture the related art vehicle ultrasonic parking assistance apparatus.

Moreover, the transformer 10 causes a loss of energy in a boosting operation, and a transmission signal can be distorted by a frequency response difference (caused by an inductance dispersion of the transformer 10) between the transmission frequency response and the matching circuit 40.

SUMMARY

Accordingly, the present invention provides a vehicle ultrasonic parking assistance apparatus including a charge pumping circuit and a method of operating the same, which change a transmission output voltage in a voltage driving scheme without using a transformer.

The present invention also provides a vehicle ultrasonic parking assistance apparatus, of which a transmitting part is implemented in a voltage driving scheme, and a method of operating the same, which reduce a size of an ultrasonic sensor and the cost by using a charge pumping circuit instead of a transformer.

In one general aspect, a vehicle ultrasonic parking assistance apparatus includes: two charge pumping circuits; and a controller configured to boost and output an input voltage Vcc by using the two charge pumping circuits, wherein when the voltage Vcc is input, the controller sets an operation mode of each of the charge pumping circuits to a charging mode, and each of the charge pumping circuits is charged with the input voltage Vcc, and when each of the charge pumping circuits is fully charged, on a basis of output voltage information predetermined according to an ambient environment of a vehicle, the controller sets an output voltage of each of the charge pumping circuits, sets the operation mode of each of the charge pumping circuits to a discharging mode, and boosts the input voltage Vcc to the set output voltage to alternately output a positive (+) high-voltage pulse and a negative (−) high-voltage pulse.

In another general aspect, a method of operating a vehicle ultrasonic parking assistance apparatus, including two charge pumping circuits, includes boosting and outputting an input voltage Vcc by using the two charge pumping circuits, wherein the outputting includes: when the voltage Vcc is input, setting an operation mode of each of the charge pumping circuits to a charging mode to charge each of the charge pumping circuits is charged with the input voltage Vcc; and when each of the charge pumping circuits is fully charged, on a basis of output voltage information predetermined according to an ambient environment of a vehicle, setting an output voltage of each of the charge pumping circuits, setting the operation mode of each of the charge pumping circuits to a discharging mode, and boosting the input voltage Vcc to the set output voltage to alternately output a positive (+) high-voltage pulse and a negative (−) high-voltage pulse.

Other features and aspects will be apparent from the following detailed description, the drawings, and the claims.

DETAILED DESCRIPTION OF EMBODIMENTS

The advantages, features and aspects of the present invention will become apparent from the following description of the embodiments with reference to the accompanying drawings, which is set forth hereinafter. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

The terms used herein are for the purpose of describing particular embodiments only and are not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 1:
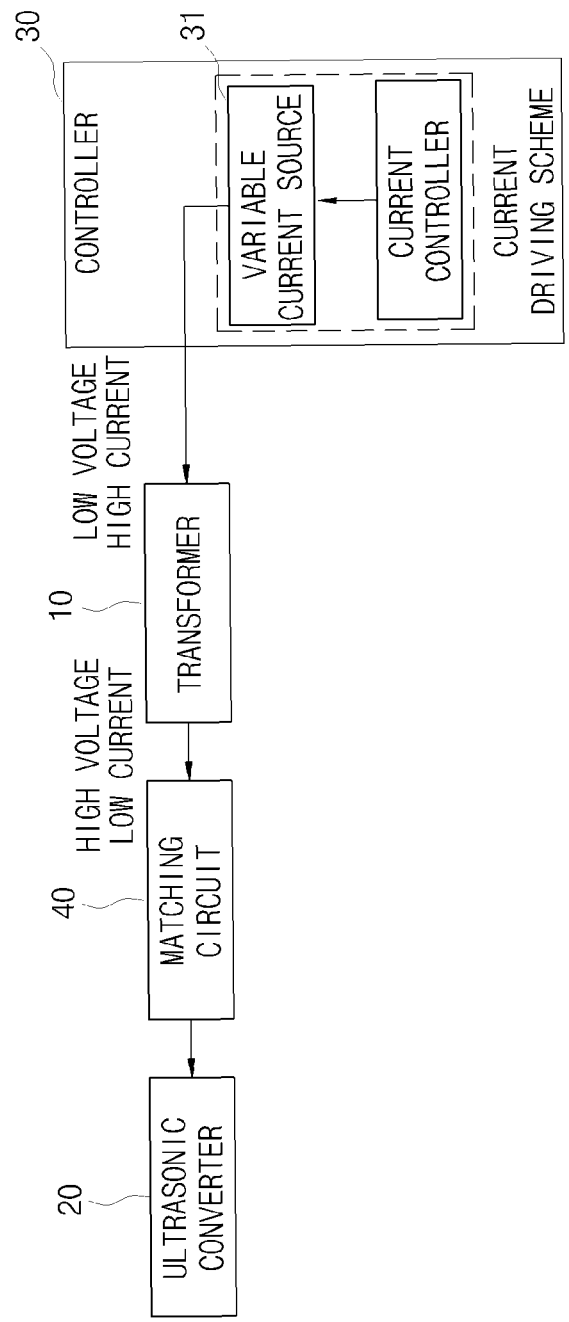
FIGS. 1 to 3 are diagrams for describing the related art.
Figure 2:
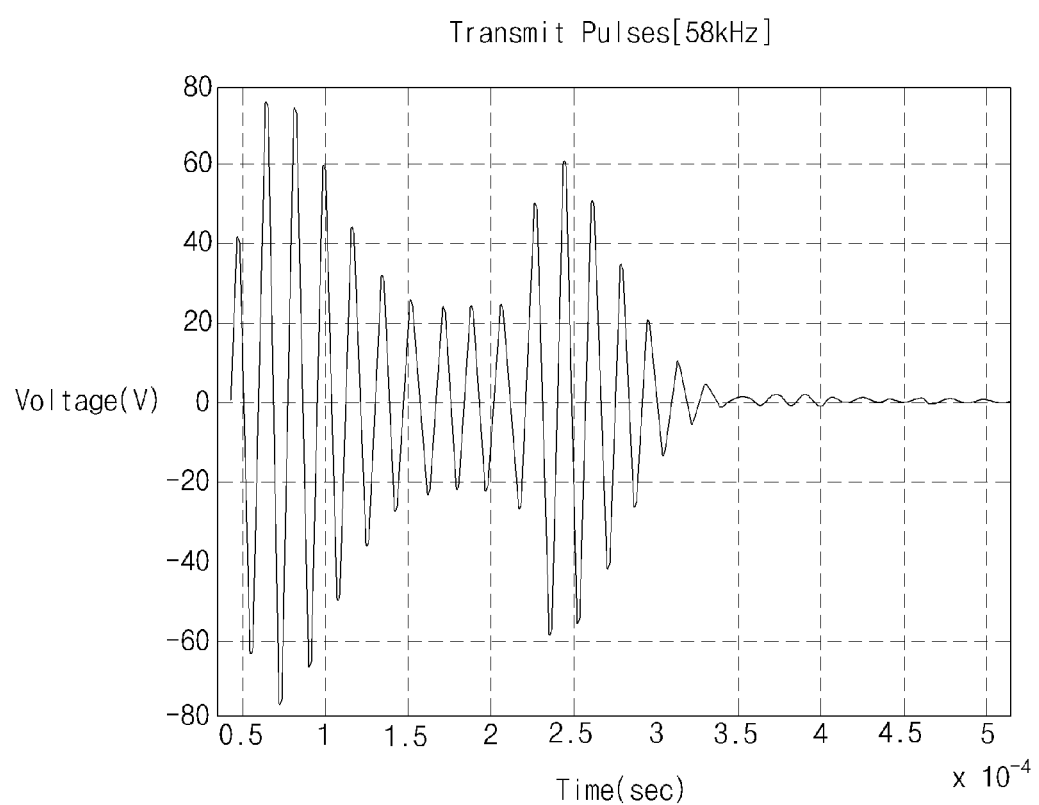
Figure 3:
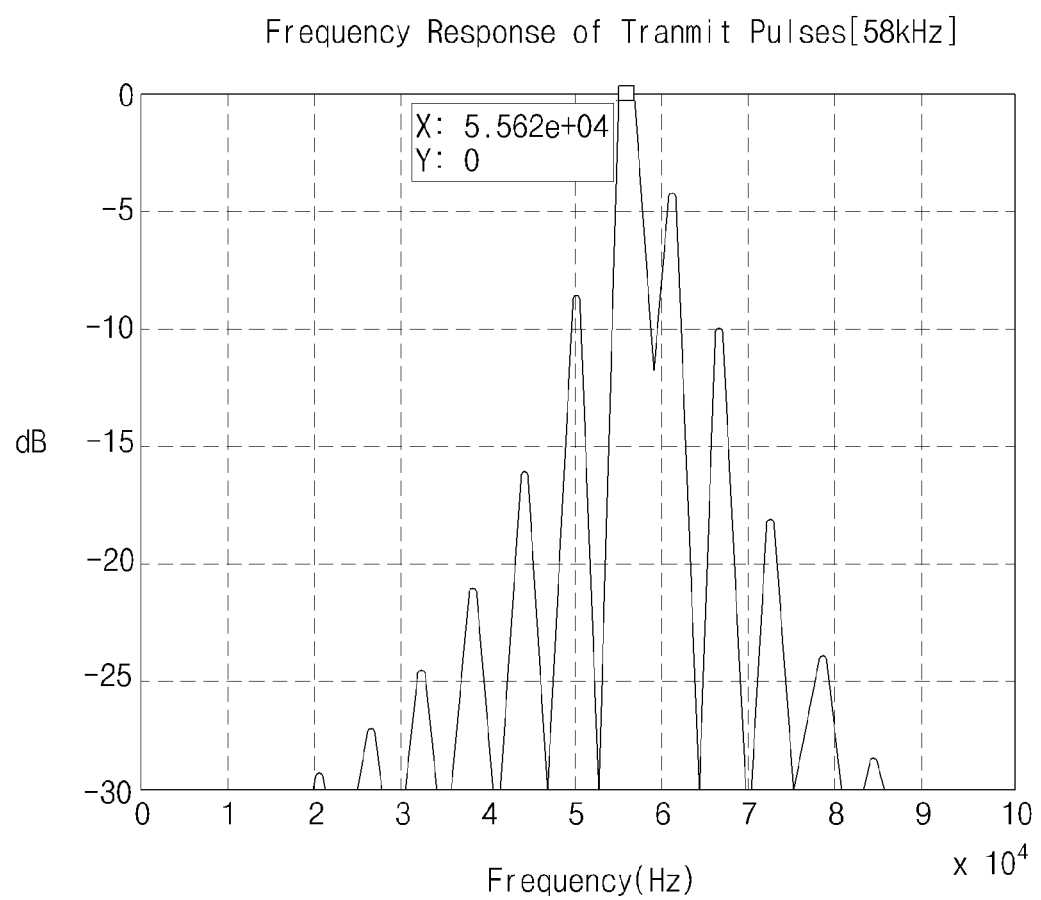
Figure 4:
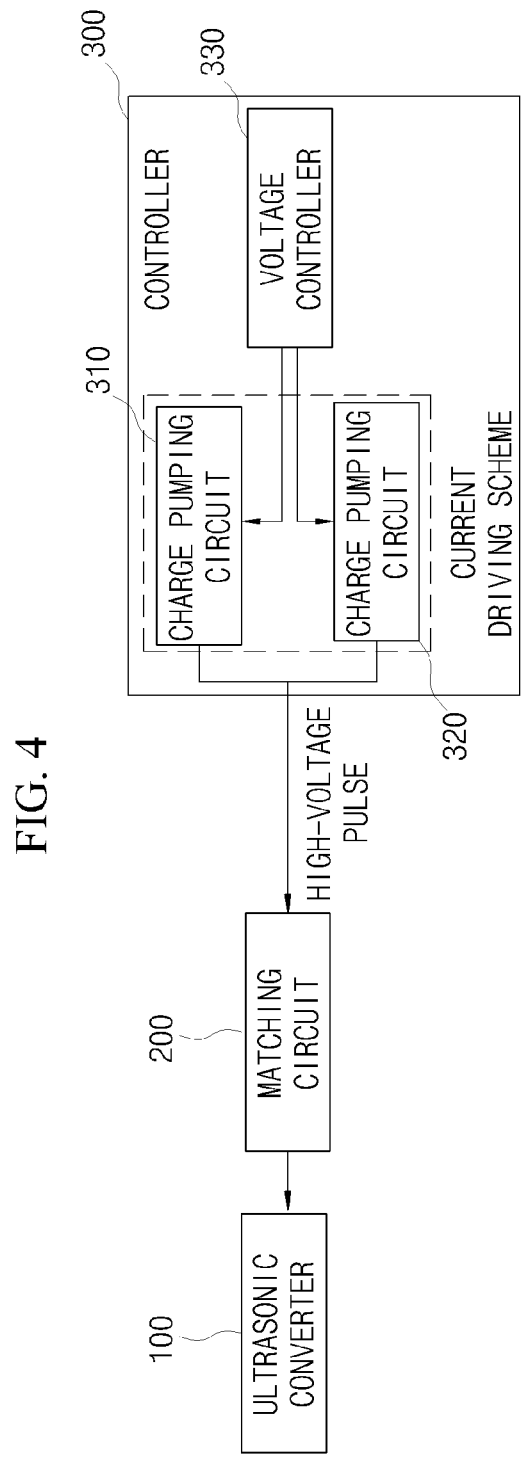
FIG. 4 is a block diagram illustrating a vehicle ultrasonic parking assistance apparatus including a charge pumping circuit according to an embodiment of the present invention.
Figure 5:
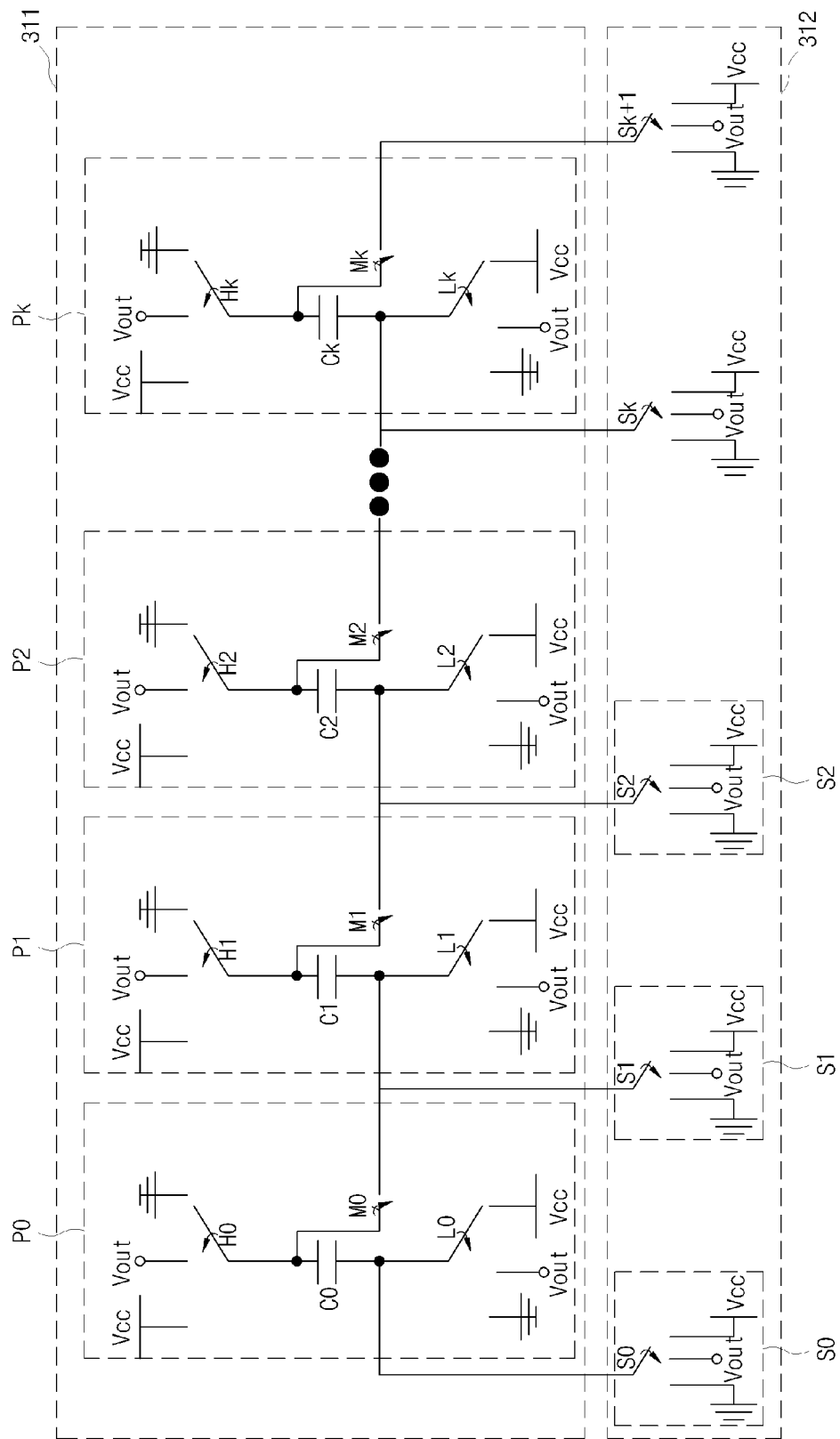
FIG. 5 is a circuit diagram illustrating the charge pumping circuit according to an embodiment of the present invention.
Figure 6:
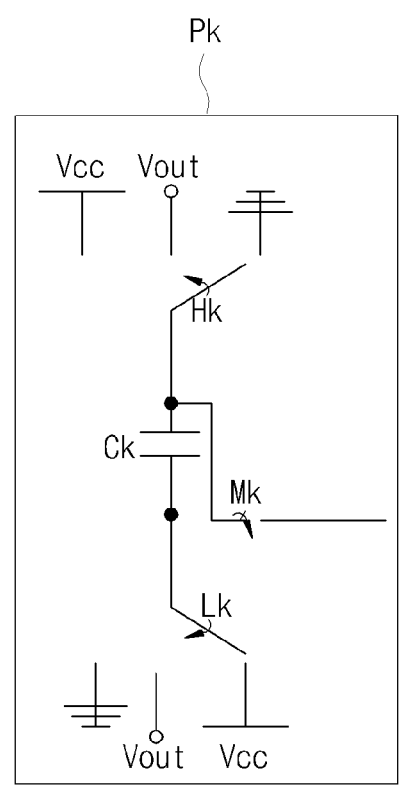
FIG. 6 is a circuit diagram illustrating a pumping unit according to an embodiment of the present invention.

Hereinafter, a vehicle ultrasonic parking assistance apparatus including a charge pumping circuit according to an embodiment of the present invention will be described in detail with reference to FIGS. 4 to 6. FIG. 4 is a block diagram illustrating a vehicle ultrasonic parking assistance apparatus including a charge pumping circuit according to an embodiment of the present invention. FIG. 5 is a circuit diagram illustrating the charge pumping circuit according to an embodiment of the present invention. FIG. 6 is a circuit diagram illustrating a pumping unit according to an embodiment of the present invention.

As illustrated in FIG. 4, the vehicle ultrasonic parking assistance apparatus including the charge pumping circuit according to an embodiment of the present invention includes an ultrasonic converter 100, a matching circuit 200, and controller 300.

The controller 300 includes two charge pumping circuits 310 and 320.

The vehicle ultrasonic parking assistance apparatus including the charge pumping circuit according to an embodiment of the present invention may boost and output a voltage by using the two charge pumping circuits 310 and 330 without using a separate boosting element (a transformer), and generate a positive high-voltage pulse and a negative high-voltage pulse.

That is, the controller 300 may directly output the high-voltage pulse without using the transformer.

As described above, since the transformer is not used, the present invention secures an area and height of a PCB which were occupied by the transformer, implements the vehicle ultrasonic parking assistance apparatus including the charge pumping circuit which is smaller and lighter than the existing transformer, and reduces the molding cost and an amount of used potting solution.

Moreover, since the transformer is not used, a nonlinear component of the transformer is removed, the matching circuit 200 is simply implemented, and mismatching caused by a dispersion of the transformer does not occur. Therefore, the vehicle ultrasonic parking assistance apparatus is implemented with the charge pumping circuit which is more stable than the existing transformer, and a loss of energy due to the transformer does not occur. Accordingly, a signal is transmitted at higher energy than the existing energy, and a higher SNR than the existing SNR is obtained, thus enhancing a performance of an apparatus.

Each of the charge pumping circuits 310 and 320, as illustrated in FIG. 5, includes a pumping unit 311 and a switching unit 312.

The pumping unit 311 includes a zeroth pumping unit P0, a first pumping unit P1, a second pumping unit P2, . . . , and a kth pumping unit Pk.

The switching unit 312 includes a zeroth switch S0, a first switch S1, a second switch S2, . . . , a kth switch Sk, and a k+1st switch Sk+1.

Each of the pumping units P0 to Pk includes three switches and one capacitor.

For example, as illustrated in FIG. 6, the kth pumping unit Pk includes a switch Hk, a switch Mk, a switch Lk, and a capacitor Ck.

One side of the switch Hk is serially connected to an input voltage Vcc terminal through switching, and the other is serially connected to the capacitor Ck and is parallelly connected to the switch Mk.

One side of the switch Mk is serially connected to the k+1st switch Sk+1, and the other is parallelly connected to the switch Hk and the capacitor Ck.

One side of the switch Lk is connected to a ground GND terminal through switching, and the other is serially connected to the capacitor Ck and is parallelly connected to the kth switch Sk and the switch Mk−1 of the K−1st pumping unit Pk−1.

One side of the capacitor Ck is serially connected to the switch Hk and is parallelly connected to the switch Mk, and the other is serially connected to the switch Lk and is parallelly connected to the kth switch Sk.

The controller 300 allows the voltage controller 330 to output the voltage Vcc, and sets an operation mode of each of the charge pumping circuits 310 and 320 to a charging mode. When the charge pumping circuits 310 and 320 are fully charged, the controller 300 sets an output voltage of each of the charge pumping circuits 310 and 320 on the basis of output voltage information predetermined according to an ambient environment of a vehicle such that the vehicle ultrasonic parking assistance apparatus according to an embodiment of the present invention maintains constant parking assistance performance regardless of the ambient environment (a temperature, a humidity, etc.) of the vehicle, and sets the operation mode of each of the charge pumping circuits 310 and 320 to a discharging mode.

When each of the charge pumping circuits 310 and 320 is set to the charging mode, the switch Hk is serially connected to the input voltage Vcc terminal through switching, the switch Mk is opened, the switch Lk is serially connected to the ground GND terminal through switching, the kth switch Sk is opened to allow the voltage Vcc to be applied to the capacitor Ck, and the capacitor Ck is charged with the applied voltage Vcc.

When each of the charge pumping circuits 310 and 320 is set to the discharging mode and an output voltage is set in order for the input voltage Vcc to be boosted by +2 times and output, the switch Hk is opened, the switch Lk is opened, the zeroth switch S0 is connected to the ground GND terminal through switching, the first switch S1 is opened, the second switch S2 is connected to an output voltage Vout terminal through switching, the switch M0 is closed, the switch M1 is closed, and the switch M2 is opened.

At this time, the third to k+1st switches S3 to Sk+1 and the switches M3 to Mk are "don't care".

For example, as described above, when the charge pumping circuit 310 is set to the discharging mode and the output voltage is set in order for the input voltage Vcc to be boosted by +2 times and output, a voltage "+2*Vcc" that is generated by boosting the input voltage Vcc by +2 times is output as the output voltage. That is, the charge pumping circuit 310 outputs a positive (+) high-voltage pulse.

Moreover, when each of the charge pumping circuits 310 and 320 is set to the discharging mode and the output voltage is set in order for the input voltage Vcc to be boosted by −2 times (−2*Vcc) and output, the switch Hk is opened, the switch Lk is opened, the zeroth switch S0 is connected to the output voltage Vout terminal through switching, the first switch S1 is opened, the second switch S2 is connected to the ground GND terminal through switching, the switch M0 is closed, the switch M1 is closed, and the switch M2 is opened.

At this time, the third to k+1st switches S3 to Sk+1 and the switches M3 to Mk are "don't care".

For example, as described above, when the charge pumping circuit 320 is set to the discharging mode and the output voltage is set in order for the input voltage Vcc to be boosted by −2 times and output, a voltage "−2*Vcc" that is generated by boosting the input voltage Vcc by −2 times is output as the output voltage. That is, the charge pumping circuit 310 outputs a negative (−) high-voltage pulse.

That is, when the controller 300 sets the charge pumping circuit 310 to the discharging mode, sets the output voltage in order for the input voltage Vcc to be boosted by +2 times and output, sets the charge pumping circuit 320 to the discharging mode, sets the output voltage in order for the input voltage Vcc to be boosted by −2 times and output, and sets a voltage to be output with a certain interval between a voltage output of the charge pumping circuit 310 and a voltage output of the charge pumping circuit 320, the charge pumping circuit 310 outputs the voltage "+2*Vcc" (which is generated by boosting the input voltage Vcc by +2 times) as the output voltage, namely, outputs the positive (+) high-voltage pulse, and the charge pumping circuit 320 outputs the voltage "−2*Vcc" (which is generated by boosting the input voltage Vcc by −2 times) as the output voltage, namely, outputs the negative (−) high-voltage pulse.

Therefore, the controller 300 may alternately output the positive (+) high-voltage pulse and the negative (−) high-voltage pulse to the matching circuit 200.

To summarize the above-described details, when each of the charge pumping circuits 310 and 320 is set to the discharging mode and the output voltage is set in order for the input voltage Vcc to be boosted by +n times (+n*Vcc, $1 \leq n \leq k$) and output, the switch Hk is opened, the switch Lk is opened, the zeroth switch S0 is connected to the ground GND terminal through switching, the first to n−1st switches S1 to Sn−1 are opened, the nth switch Sn is connected to the output voltage Vout terminal through switching, the switches M0 to Mn−1 are closed, and the switch Mn is opened.

At this time, the n+1st to k+1st switches Sn+1 to Sk+1 and the switches Mn+1 to Mk are "don't care".

Therefore, each of the charge pumping circuits 310 and 320 may output a voltage "+n*Vcc" (which is generated by boosting the input voltage Vcc by +n times) as the output voltage.

Moreover, when each of the charge pumping circuits 310 and 320 is set to the discharging mode and the output voltage is set in order for the input voltage Vcc to be boosted by −n times (−n*Vcc) and output, the switch Hk is opened, the switch Lk is opened, the zeroth switch S0 is connected to the output voltage Vout terminal through switching, the first to n−1st switches S1 to Sn−1 are opened, the nth switch Sn is connected to the ground GND terminal through switching, the switches M0 to Mn−1 are closed, and the switch Mn is opened.

At this time, the n+1st to k+1st switches Sn+1 to Sk+1 and the switches Mn+1 to Mk are "don't care".

Therefore, each of the charge pumping circuits 310 and 320 may output a voltage "−n*Vcc" (which is generated by boosting the input voltage Vcc by −n times) as the output voltage.

As described above, by using the charge pumping circuit instead of the transformer so as to boost a voltage, the present invention reduces the manufacturing cost, and inputs a signal to the ultrasonic converter at the same voltage as a voltage of when the transformer is used. The charge pumping circuit is provided at a region in which the variable current source was provided, and thus, the manufacturing cost is not additionally expended. Since only a conversion of energy by the ultrasonic converter is considered, designing is simplified. Since the transformer is not used, a reduction in performance and a loss of energy due to a nonlinear component of the transformer are prevented, and thus, a high-energy signal is transmitted. Accordingly, the SNR of a reception signal becomes higher, namely, a high SNR is obtained, and thus, a detection error of an object is reduced, and an object located at a long distance is accurately detected. As a result, a performance of an apparatus is enhanced.

Figure 7:
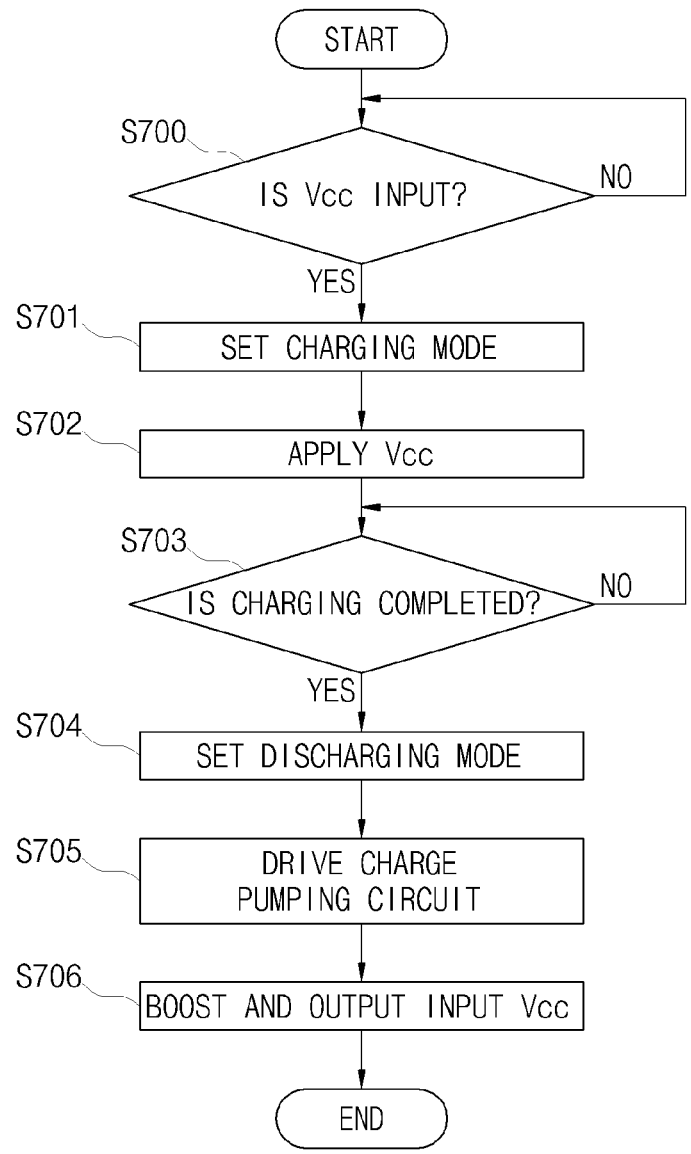
FIG. 7 is a flowchart illustrating a method of operating the vehicle ultrasonic parking assistance apparatus including the charge pumping circuit according to an embodiment of the present invention.

Hereinabove, the vehicle ultrasonic parking assistance apparatus including the charge pumping circuit according to an embodiment of the present invention has been described with reference to FIGS. 4 to 6. Hereinafter, a method of operating the vehicle ultrasonic parking assistance apparatus including the charge pumping circuit according to an embodiment of the present invention will be described in detail with reference to FIG. 7. FIG. 7 is a flowchart illustrating a method of operating the vehicle ultrasonic parking assistance apparatus including the charge pumping circuit according to an embodiment of the present invention.

As illustrated in FIG. 7, the method determines whether the voltage Vcc is output from the voltage controller 330. For example, the method determines whether the voltage Vcc output from the voltage controller 330 is input to each of the charge pumping circuits 310 and 320 in operation S700.

When it is determined that the voltage Vcc output from the voltage controller 330 is input to each of the charge pumping circuits 310 and 320, the method sets the operation mode of each of the charge pumping circuits 310 and 320 to the charging mode, in operation S701.

For example, on the basis of operation information corresponding to the set charging mode, the method serially connects the switch Hk of each of the charge pumping circuits 310 and 320 to the input voltage Vcc terminal through switching, opens the switch Mk, serially connects the switch Lk to the ground GND terminal, and opens the kth switch Sk.

In operation S702, the voltage Vcc is applied to the charge pumping circuit 310 set to the charging mode, and thus, the capacitor Ck is charged with the applied voltage Vcc.

The method determines whether each of the charge pumping circuits 310 and 320 is fully charged in operation S703. When it is determined that each of the charge pumping circuits 310 and 320 is fully charged, the controller 300 sets the output voltage of each of the charge pumping circuits 310 and 320 on the basis output voltage information of predetermined according to an ambient environment of a vehicle such that the vehicle ultrasonic parking assistance apparatus according to an embodiment of the present invention maintains constant parking assistance performance regardless of the ambient environment (a temperature, a humidity, etc.) of the vehicle, and sets the operation mode of each of the charge pumping circuits 310 and 320 to a discharging mode, in operation S704.

For example, when the operation mode is set to the discharging mode and the output voltage is set in order for the input voltage Vcc to be boosted by +n times (+n*Vcc) and output, the switch Hk of the charge pumping circuit 310 is opened, the switch Lk is opened, the zeroth switch S0 is connected to the ground GND terminal through switching, the first to n−1st switches S1 to Sn−1 are opened, the nth switch Sn is connected to the output voltage Vout terminal through switching, the switches M0 to Mn−1 are closed, and the switch Mn is opened, in operation S705.

At this time, the n+1st to k+1st switches Sn+1 to Sk+1 and the switches Mn+1 to Mk are "don't care".

Therefore, the charge pumping circuit 310 may output the voltage "+n*Vcc" (which is generated by boosting the input voltage Vcc by +n times) as the output voltage, in operation S706.

Moreover, when the charge pumping circuit 320 is set to the discharging mode and the output voltage is set in order for the input voltage Vcc to be boosted by −n times (−n*Vcc) and output, the switch Hk is opened, the switch Lk is opened, the zeroth switch S0 is connected to the output voltage Vout terminal through switching, the first to n−1st switches S1 to Sn−1 are opened, the nth switch Sn is connected to the ground GND terminal through switching, the switches M0 to Mn−1 are closed, and the switch Mn is opened.

At this time, the n+1st to k+1st switches Sn+1 to Sk+1 and the switches Mn+1 to Mk are "don't care".

Therefore, the charge pumping circuit 320 may output the voltage "−n*Vcc" (which is generated by boosting the input voltage Vcc by −n times) as the output voltage.

That is, the charge pumping circuit 310 may output the positive (+) high-voltage pulse, and the charge pumping circuit 320 may output the negative (−) high-voltage pulse. Therefore, the positive (+) high-voltage pulse and the negative (−) high-voltage pulse may be alternately input to the matching circuit 200.

As described above, by using the charge pumping circuit instead of the transformer so as to boost a voltage, the present invention reduces the manufacturing cost, and inputs a signal to the ultrasonic converter at the same voltage as a voltage of when the transformer is used.

Moreover, the charge pumping circuit is provided at a region in which the variable current source was provided, and thus, the manufacturing cost is not additionally expended.

Moreover, since only a conversion of energy by the ultrasonic converter is considered, designing is simplified.

Moreover, since the transformer is not used, a reduction in performance and a loss of energy due to a nonlinear component of the transformer are prevented, and thus, a high-energy signal is transmitted. Accordingly, the SNR of a reception signal becomes higher, namely, a high SNR is obtained, and thus, a detection error of an object is reduced, and an object located at a long distance is accurately detected.

As a result, a performance of an apparatus is enhanced.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A vehicle ultrasonic parking assistance apparatus comprising:
    two charge pumping circuits; and
    a controller configured to boost and output an input voltage Vcc by using the two charge pumping circuits,
    wherein,
    when the voltage Vcc is input, the controller sets an operation mode of each of the charge pumping circuits to a charging mode, and each of the charge pumping circuits is charged with the input voltage Vcc, and
    when each of the charge pumping circuits is fully charged, on a basis of output voltage information predetermined according to an ambient environment of a vehicle, the controller sets an output voltage of each of the charge pumping circuits, sets the operation mode of each of the charge pumping circuits to a discharging mode, and boosts the input voltage Vcc to the set output voltage to alternately output a positive (+) high-voltage pulse and a negative (−) high-voltage pulse.

2. The vehicle ultrasonic parking assistance apparatus of claim 1, wherein each of the charge pumping circuits comprises:
    a pumping unit configured to comprise a zeroth pumping unit, a first pumping unit, a second pumping unit, . . . , and a kth pumping unit, each of the zeroth to kth pumping units comprising a switch H, a switch M, a switch L, and a capacitor C; and
    a switching unit configured to comprise a zeroth switch, a first switch, a second switch, . . . , a kth switch, and a k+1st switch.

3. The vehicle ultrasonic parking assistance apparatus of claim 2, wherein,
    the kth pumping unit comprises a switch Hk, a switch Mk, a switch Lk, and a capacitor Ck, and
    one side of a switch Hk is serially connected to a voltage Vcc terminal through switching, and the other is serially connected to the capacitor Ck and is parallelly connected to the switch Mk,
    one side of the switch Mk is serially connected to the k+1st switch, and the other is parallelly connected to the switch Hk and the capacitor Ck,
    one side of the switch Lk is connected to a ground GND terminal through switching, and the other is serially connected to the capacitor Ck and is parallelly connected to the kth switch and a switch Mk−1 of the K−1st pumping unit, and
    one side of the capacitor Ck is serially connected to the switch Hk and is parallelly connected to the switch Mk, and the other is serially connected to the switch Lk and is parallelly connected to the kth switch.

4. The vehicle ultrasonic parking assistance apparatus of claim 3, wherein in each of the charge pumping circuits,
    when the operation mode is set to the discharging mode, and the output voltage is set for the input voltage Vcc to be boosted to a voltage "+n*Vcc" (1<=n<=k) and output,
    the switch Hk and switch Lk of the kth pumping unit are opened, the zeroth switch is connected to the ground GND terminal through switching, the first to n−1st switches are opened, the nth switch is connected to an output voltage Vout terminal through switching, the switch M0 of the zeroth pumping unit to the switch Mn−1 of the n−1st pumping unit are closed, and the switch Mn of the nth pumping unit is opened, and
    the n+1st to k+1st switches and the switch Mn+1 of the n+1st pumping unit to the switch Mk of the kth pumping unit are "don't care".

5. The vehicle ultrasonic parking assistance apparatus of claim 3, wherein each of the charge pumping circuits,
    When the operation mode is set to the discharging mode, and the output voltage is set for the input voltage Vcc to be boosted to a voltage "−n*Vcc" (1<=n<=k) and output,
    the switch Hk and switch Lk of the kth pumping unit are opened, the zeroth switch is connected to an output voltage Vout terminal through switching, the first to n−1st switches are opened, the nth switch is connected to the ground GND terminal through switching, the switch M0 of the zeroth pumping unit to the switch Mn−1 of the n−1st pumping unit are closed, and the switch Mn of the nth pumping unit is opened, and
    the n+1st to k+1st switches and the switch Mn+1 of the n+1st pumping unit to the switch Mk of the kth pumping unit are "don't care".

6. The vehicle ultrasonic parking assistance apparatus of claim 3, wherein in each of the charge pumping circuit,
    when the operation mode is set to the charging mode, the switch Hk of the kth pumping unit is serially connected to the voltage Vcc terminal through switching, the switch Mk of the kth pumping unit is opened, the switch Lk of the kth pumping unit is serially connected to the ground GND terminal through switching, the kth switch Sk is opened to allow the voltage Vcc to be applied to the capacitor Ck, and the capacitor Ck is charged with the applied voltage Vcc.

7. A method of operating a vehicle ultrasonic parking assistance apparatus, including two charge pumping circuits, the method comprising boosting and outputting an input voltage Vcc by using the two charge pumping circuits,
    wherein the outputting comprises:
    when the voltage Vcc is input, setting an operation mode of each of the charge pumping circuits to a charging mode to charge each of the charge pumping circuits is charged with the input voltage Vcc; and
    when each of the charge pumping circuits is fully charged, on a basis of output voltage information predetermined according to an ambient environment of a vehicle, setting an output voltage of each of the charge pumping circuits, setting the operation mode of each of the charge pumping circuits to a discharging mode, and boosting the input voltage Vcc to the set output voltage to alternately output a positive (+) high-voltage pulse and a negative (−) high-voltage pulse.

8. The method of claim 7, wherein each of the charge pumping circuits comprises:
    a pumping unit configured to comprise a zeroth pumping unit, a first pumping unit, a second pumping unit, . . . , and a kth pumping unit, each of the zeroth to kth pumping units comprising a switch H, a switch M, a switch L, and a capacitor C; and a switching unit configured to comprise a zeroth switch, a first switch, a second switch, . . . , a kth switch, and a k+1st switch.

9. The method of claim 8, wherein the kth pumping unit comprises a switch Hk, a switch Mk, a switch Lk, and a capacitor Ck, and one side of a switch Hk is serially connected to a voltage Vcc terminal through switching, and the other is serially connected to the capacitor Ck and is parallelly connected to the switch Mk, one side of the switch Mk is serially connected to the k+1st switch, and the other is parallelly connected to the switch Hk and the capacitor Ck, one side of the switch Lk is connected to a ground GND terminal through switching, and the other is serially connected to the capacitor Ck and is parallelly connected to the kth switch and a switch Mk−1 of the K−1st pumping unit, and one side of the capacitor Ck is serially connected to the switch Hk and is parallelly connected to the switch Mk, and the other is serially connected to the switch Lk and is parallelly connected to the kth switch.

10. The method of claim 9, wherein, the boosting comprises:

when the operation mode is set to the discharging mode, and the output voltage is set for the input voltage Vcc to be boosted to a voltage "+n*Vcc" (1<=n<=k) and output, opening the switch Hk and switch Lk of the kth pumping unit, the switch Mn of the nth pumping unit, and the first to n−1st switches;

connecting the zeroth switch to the ground GND terminal through switching, and connecting the nth switch to an output voltage Vout terminal through switching; and closing the switch M0 of the zeroth pumping unit to the switch Mn−1 of the n−1st pumping unit, and the n+1st to k+1st switches and the switch Mn+1 of the n+1st pumping unit to the switch Mk of the kth pumping unit are "don't care".

11. The method of claim 9, wherein, the boosting comprises:

when the operation mode is set to the discharging mode, and the output voltage is set for the input voltage Vcc to be boosted to a voltage "−n*Vcc" (1<=n<=k) and output, opening the switch Hk and switch Lk of the kth pumping unit, the first to n−1st switches, and the switch Mn of the nth pumping unit;

connecting the zeroth switch to an output voltage Vout terminal through switching, and connecting the nth switch to the ground GND terminal through switching; and closing the switch M0 of the zeroth pumping unit to the switch Mn−1 of the n−1st pumping unit, and the n+1st to k+1st switches and the switch Mn+1 of the n+1st pumping unit to the switch Mk of the kth pumping unit are "don't care".

12. The method of claim 9, wherein the charging comprises:

when the operation mode is set to the charging mode, serially connecting the switch Hk of the kth pumping unit to the voltage Vcc terminal through switching, and serially connecting the switch Lk of the kth pumping unit to the ground GND terminal through switching; and opening the switch Mk of the kth pumping unit and the kth switch.

* * * * *